(12) United States Patent
Pedersen

(10) Patent No.: US 10,396,001 B2
(45) Date of Patent: Aug. 27, 2019

(54) OFFSET TEST PADS FOR WLCSP FINAL TEST

(71) Applicant: Adesto Technologies Corporation, Santa Clara, CA (US)

(72) Inventor: Bard M. Pedersen, Fremont, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/737,470

(22) PCT Filed: Aug. 15, 2016

(86) PCT No.: PCT/US2016/046968
§ 371 (c)(1),
(2) Date: Dec. 18, 2017

(87) PCT Pub. No.: WO2017/031027
PCT Pub. Date: Feb. 23, 2017

(65) Prior Publication Data
US 2019/0006249 A1    Jan. 3, 2019

Related U.S. Application Data

(60) Provisional application No. 62/207,661, filed on Aug. 20, 2015.

(51) Int. Cl.
*G01R 31/28*    (2006.01)
*H01L 21/66*    (2006.01)
(Continued)

(52) U.S. Cl.
CPC .......... *H01L 22/32* (2013.01); *G01R 31/2818* (2013.01); *H01L 23/12* (2013.01);
(Continued)

(58) Field of Classification Search
CPC ....... H01L 22/32; H01L 23/12; H01L 23/498; H01L 23/50; H01L 31/2818; H01L 23/3114; H01L 23/05; H01L 24/06; H01L 24/13; H01L 2224/11; H01L 23/3171; H01L 2224/02373; H01L 2224/0401; H01L 2224/05124; H01L 2224/0612;
(Continued)

(56) References Cited

U.S. PATENT DOCUMENTS 6,542,377 B1    4/2003 Fisher et al.
8,656,333 B1 *  2/2014 Bishop .............. H01L 23/49838
                                              257/737

(Continued)

*Primary Examiner* — Alexander O Williams
(74) *Attorney, Agent, or Firm* — Michael C. Stephens, Jr.

(57) ABSTRACT

A device configured for WLCSP, can include: a first pad; a test pad offset from the first pad; a first RDL path that connects the first pad to the test pad; and a second RDL path that connects the test pad to a solder ball. In another case, a device configured for WLCSP can include: a first pad; a test pad offset from the first pad; a first RDL path that connects the first pad to a solder ball; and a second RDL path that connects the test pad to the solder ball. A wafer having devices configured for WLCSP, can include: a first device having a first pad; a second device having a test pad; a first RDL path that connects the first pad to a solder ball; and a second RDL path that connects the test pad to the solder ball.

20 Claims, 10 Drawing Sheets

(51) Int. Cl.
*H01L 23/00* (2006.01)
*H01L 23/12* (2006.01)
*H01L 23/31* (2006.01)
*H01L 23/50* (2006.01)
*H01L 23/498* (2006.01)

(52) U.S. Cl.
CPC ........ *H01L 23/3114* (2013.01); *H01L 23/498* (2013.01); *H01L 23/50* (2013.01); *H01L 24/05* (2013.01); *H01L 24/06* (2013.01); *H01L 24/13* (2013.01); *H01L 23/3171* (2013.01); *H01L 2224/02371* (2013.01); *H01L 2224/02373* (2013.01); *H01L 2224/0401* (2013.01); *H01L 2224/05124* (2013.01); *H01L 2224/0612* (2013.01); *H01L 2224/11* (2013.01); *H01L 2224/13024* (2013.01); *H01L 2924/1443* (2013.01)

(58) Field of Classification Search
CPC . H01L 2224/013024; H01L 2924/1443; H01L 21/66; H01L 23/00; H01L 23/31; G01R 21/28
USPC .......................................................... 257/48
See application file for complete search history.

(56) References Cited

U.S. PATENT DOCUMENTS

| | | | |
|---|---|---|---|
| 2006/0139896 A1 | 6/2006 | Bambridge et al. | |
| 2008/0128905 A1* | 6/2008 | Lee .................... | H01L 23/3114 257/737 |
| 2008/0265408 A1* | 10/2008 | Kaufmann .......... | H01L 23/3114 257/723 |
| 2010/0193959 A1 | 8/2010 | Grygiel | |
| 2010/0308460 A1 | 12/2010 | Harvey | |
| 2013/0240883 A1* | 9/2013 | Chen ..................... | H01L 22/34 257/48 |
| 2014/0077381 A1 | 3/2014 | Lin et al. | |
| 2014/0252558 A1* | 9/2014 | Yu ........................ | H01L 23/544 257/618 |
| 2018/0108542 A1* | 4/2018 | Pagaila ................. | H01L 21/568 |
| 2018/0254216 A1* | 9/2018 | Scanlan ................. | H01L 24/19 |
| 2018/0269181 A1* | 9/2018 | Yang .................... | H01L 25/0655 |
| 2018/0286784 A1* | 10/2018 | Cheng .................. | H01L 23/5226 |
| 2018/0294186 A1* | 10/2018 | Lam ................... | H01L 21/76837 |

* cited by examiner

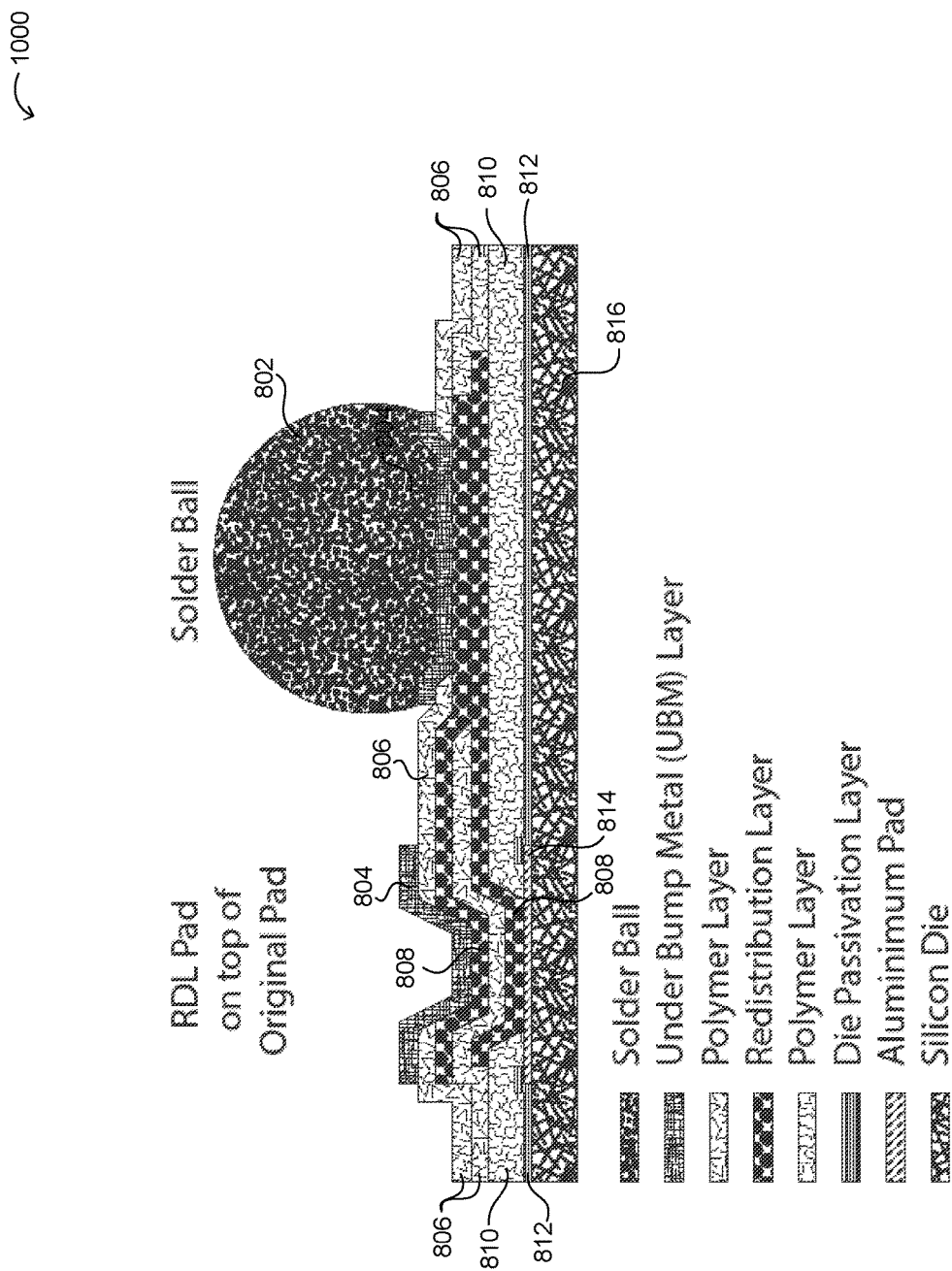

US 10,396,001 B2

OFFSET TEST PADS FOR WLCSP FINAL TEST

RELATED APPLICATIONS

This application claims the benefit of U.S. Provisional Application No. 62/207,661, filed Aug. 20, 2015, and is the National Stage of International Application No. PCT/US16/046968, filed Aug. 15, 2016, all of which are incorporated herein by reference in their entirety.

FIELD OF THE INVENTION

The present invention generally relates to the field of testing of semiconductor devices and wafers. More specifically, embodiments of the present invention pertain to wafer level chip scale package (WLCSP) testing procedures and devices.

BACKGROUND

Final test of WLCSP devices is typically done by testing the bumped wafer on a probe station, followed by an optical inspection after dicing. This approach requires a separate probe card (or two) for the final test step. Further, the cost of these probe cards may be among the largest portion of nonrecurring expenses for WLCSP testing procedures. In addition, electrical testing after singulation or separation of the die may not typically be performed. Rather, errors caused by dicing may usually be found by the optical inspection.

BRIEF DESCRIPTION OF THE DRAWINGS

FIG. 10 is a side view diagram of an example two layer RDL design, in accordance with embodiments of the present invention.

DETAILED DESCRIPTION OF EMBODIMENTS

Figure 1:
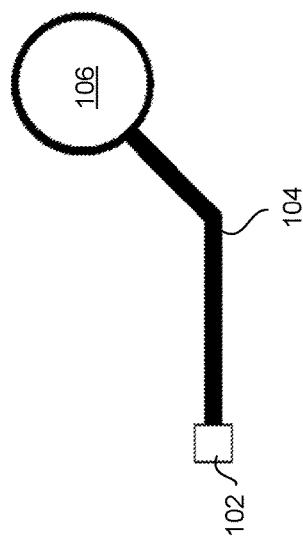
FIG. 1 is an example WLCSP design with open pads, in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Wafer level chip scale packaging (WLCSP) refers to the technology of packaging an integrated circuit at a wafer level, resulting in a device that is practically the same size as the die. While the name implies devices would be packaged, the bare die can actually be modified to add environmental protection layers and solder balls that are then used as the direct connection to the package carrier or substrate. WLCSP technology can allow devices to be integrated in the design by using the smallest possible form factor, and WLCSP devices may require no additional process steps on surface mount assembly lines.

In WLCSP, the bare die can be processed to have solder balls attached directly to the device, which can remove the need for external casing and wiring in some cases. For example, silicon die can be covered with a nitride passivation layer, except for pad openings in some cases. A polymer dielectric can then be added, followed by deposition of under bump metallization (UBM). A solder ball can then be attached to each UBM stud. After processing, the device can be a die with an array pattern of solder balls, which can be attached at a pitch that is comparable to traditional circuit board (e.g., printed-circuit board [PCB]) assembly processes. In this way, there may be no need for external packaging material in order to protect the chip.

There are some situations where the standard test setup may not be the best option. For example, if all signals are not each routed out to a separate ball, the tester may not have access to all desired test signals. For example, various memory devices (e.g., non-volatile memory [NVM] devices) may typically be configured as 8-pin devices, but some can alternately be configured as 4-ball inter-integrated circuit (I2C) devices. Thus, different interface protocols may have corresponding pin or ball configurations. In such a case, the device may be functional, but the tester may not have access to all of the test signals required or desired for a complete and final test. In addition, the cost of x256 or x512 probe cards may be relatively high. If the same test card that is used for wafer probe can be reused for final test, significant cost savings can result. Along these lines, the reduced cost may facilitate adoption of WLCSP devices as a package option for the die, thus increasing device offerings.

In one embodiment, a device configured for WLCSP, can include: (i) a first pad; (ii) a test pad offset from the first pad; (iii) a first redistribution layer (RDL) path that connects the first pad to the test pad; and (iv) a second RDL path that connects the test pad to a solder ball. In another embodiment, a device configured for WLCSP, can include: (i) a first pad; (ii) a test pad offset from the first pad; (iii) a first RDL path that connects the first pad to a solder ball; and (iv) a second RDL path that connects the test pad to the solder ball. In another embodiment, a wafer having devices configured for WLCSP, can include: (i) a first device having a first pad; (ii) a second device having a test pad; (iii) a first RDL path that connects the first pad to a solder ball; and (iv) a second RDL path that connects the test pad to the solder ball. In yet another embodiment, a device configured for WLCSP, can include: (i) a first pad; (ii) a first RDL path that connects the first pad to a solder ball; and (iii) a second RDL path that connects the first pad to the solder ball, where the first and second RDL paths are in different layers.

Referring now to FIG. 1, shown is an example WLCSP design with open pads, in accordance with embodiments of the present invention. In example 100, the design of the WLCSP can be related to a standard WLCSP design, except that original pad 102 may be left exposed. The polymer layer that typically covers both the pad and the RDL may have openings over the pads, thus allowing the probe to contact the pad. RDL 104 can cover the entire pad, and may provide a connection to solder ball 106. In addition, there may also be a UBM layer on top of the pad, in order to further protect the pad. This option may be suitable for any die, and regardless of pad layout. However, there may be some concern as to exposure of pad 102 over the lifetime of the product, such as possible damage due to corrosion.

Figure 2:
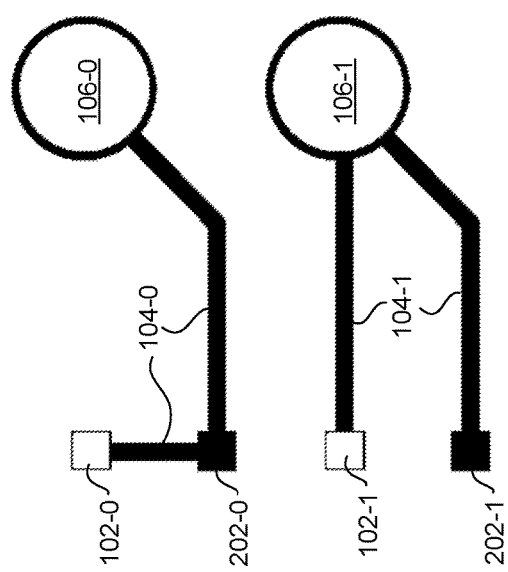
FIG. 2 is an example WLCSP design with offset pads and a short offset, in accordance with embodiments of the present invention.

Referring now to FIG. 2, shown is an example WLCSP design with offset pads and a short offset, in accordance with embodiments of the present invention. Example 200 may be suitable when there is sufficient space between the pads to allow room for extra pads between them. In this case, the offset, or the distance between each original pad 102 and each test pad 202, can be exactly the same for each such arrangement on the die. Thus, room on the die for stepping of all pads may need to be allocated. In the top example, test pad 202-0 may be routed directly via RDL paths 104-0 from original pad 102-0, and to solder ball 106-0. While this approach can provide a better test interface for high speed testing, the interface between original pad 102-0 and ball 106-0 may not be tested. In the bottom example, RDL paths 104-1 can connect to original pad 102-1 to test pad 202-1 via ball 106-1. This approach can ensure that RDL path(s) 104-1 are continuous all the way to the ball. Further, this approach can be accomplished with substantially no additional costs, and corrosion of the RDL or pads may not be a particular concern for this setup.

In the top example, RDL paths 104-0 from original pad 102-0, and to solder ball 106-0 can be formed in a same layer (e.g., level or type of metallization) or in two different layers. For example, RDL path 104-0 from original pad 102-0 to test pad 202-0 may be formed in one layer, while RDL path 104-0 from test pad 202-0 to solder ball 106-0 may be formed in a different layer. Similarly, RDL paths 104-1 from original pad 102-1 to solder ball 106-1, and RDL path 104-1 from test pad 202-1 to solder ball 106-1, can be formed in a same layer or in two different layers. For example, RDL path 104-1 from original pad 102-1 to solder ball 106-1 may be formed in one layer, while RDL path 104-1 from test pad 202-1 to solder ball 106-1 may be formed in a different layer. In addition, the polymer layer can cover original pads 102 and RDL paths 104, and may have openings over test pads 202, thus allowing the probe to contact the test pads.

Figure 3:
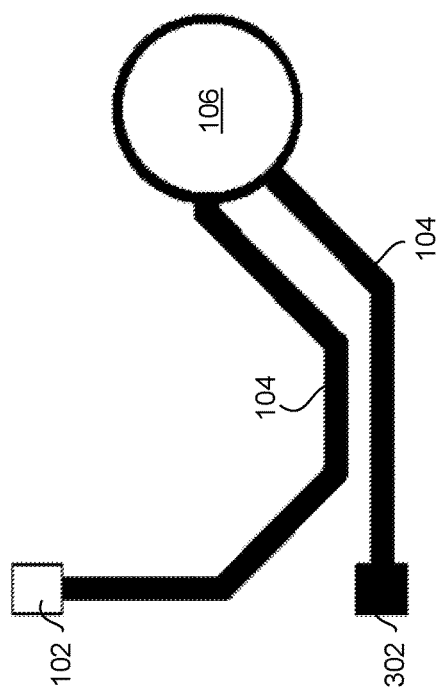
FIG. 3 is an example WLCSP design with offset pads and a long offset, in accordance with embodiments of the present invention.

Referring now to FIG. 3, shown is an example WLCSP design with offset pads and a long offset, in accordance with embodiments of the present invention. Example 300 may be suitable for when there is not sufficient space between the pads to allow room for extra pads between them. Here, test pad 302 can be offset from original pad 102, and RDL paths 104 can connect the pads via ball 106. Instead of stepping each pad on a relatively short jump, all pads can be stepped as a group. As in the above example, the offset, or the distance between each original pad 102 and each test pad 302, can be exactly the same for each such arrangement on the die. There must be room allocated on the die for stepping all pads, but possible corrosion of the RDL and/or pads may not be of particular concern for this setup, and there may be no additional associated costs.

In this example, RDL paths 104 from original pad 102 to solder ball 106, and RDL path 104 from test pad 302 to solder ball 106, can be formed in a same layer or in two different layers. For example, RDL path 104 from original pad 102 to solder ball 106 may be formed in one layer, while RDL path 104 from test pad 302 to solder ball 106 may be formed in a different layer. In addition, the polymer layer can cover original pads 102 and RDL paths 104, and may have openings over test pads 302, thus allowing the probe to contact the test pads.

Figure 4:
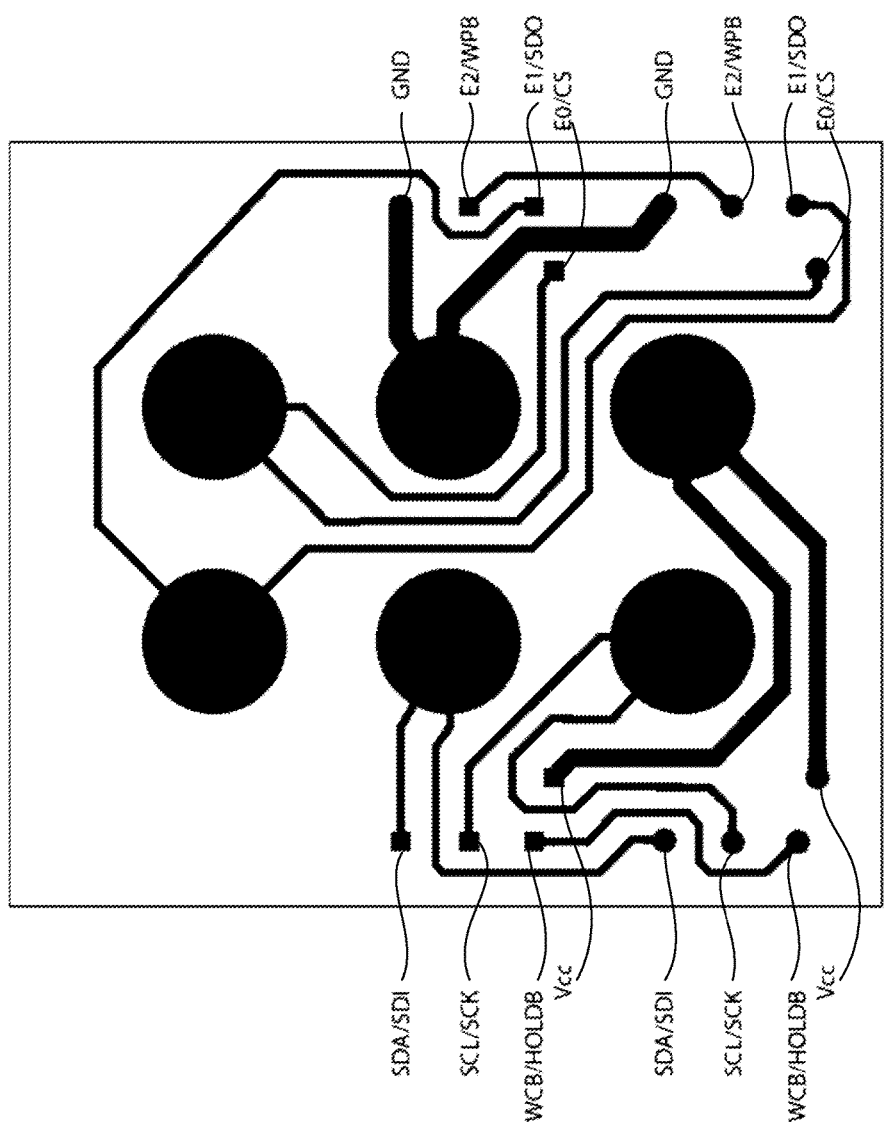
FIG. 4 is an example device with WLCSP and offset pads and a long offset, in accordance with embodiments of the present invention.

Referring now to FIG. 4, shown is an example device with WLCSP and offset pads and a long offset, in accordance with embodiments of the present invention. Example 400 is one particular example of a serial NVM device where pad offset technology can be used. Here, a relatively long offset approach is utilized; however, in other pad arrangements a shorter offset can be employed. As shown in the figure, the original pads can be represented by square shapes, and the offset test pads can be represented by the small circular shapes, or vice versa. Of course, the balls may be represented as the large circular shapes.

Figure 5:
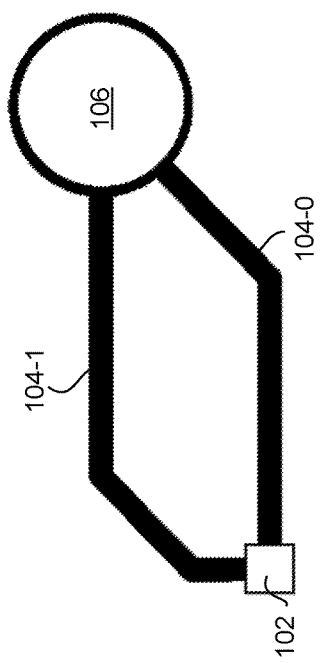
FIG. 5 is an example two layer RDL design, in accordance with embodiments of the present invention.

Referring now to FIG. 5, shown is an example two layer RDL design, in accordance with embodiments of the present invention. Example 500 can be utilized for devices where there is little or no room for offset pads, and/or the option of example 100 is considered too risky. In this particular example, two RDL layers (e.g., 104-0 and 104-1) can be employed to connect original pad 102 to solder ball 106 as part of RDL path 104. For example, the top RDL layer (e.g., 104-0) may not be directly connected to original pad 102 located under it, while the bottom RDL layer (e.g., 104-1) does connect to original pad 102, and the signal may be routed via solder ball 106. In this way, the original pad can be substantially protected from corrosion. The RDL pad, or portion of the top RDL layer that is over original pad 102, can thus be considered an offset test pad with a horizontal offset of zero, and with a small vertical offset. This approach may be suitable for a wafer that has pads in all four corners, but this option may increase costs. Further, this approach may be suitable as an option for devices where not all pads have balls connected to them, and final test has to be done on the pads. As such, in this case the polymer layer can cover RDL paths 104, but may have openings over original pad 102.

In another example, a version of the long offset approach can be adapted whereby some of the test pads are moved to a neighboring die. This approach may be suitable as an alternative to the option of example 100 for devices that have pads in all corners, and a shorter step may not be feasible. This setup does not add to RDL cost, but it may violate design guidelines for WLCSP. In this case, additional metal can be deposited across the scribe lines, thus affecting wafer dicing. Some of the test pads may be cut off after dicing as a result, which can mean probing of the device with the original probe card for quality assurance (QA) purposes may not be possible. However, this can still be done on a separate set of test pads that is not a copy of the original pad layout, and such a pad layout may be standardized for probe card cost savings.

Figure 6:
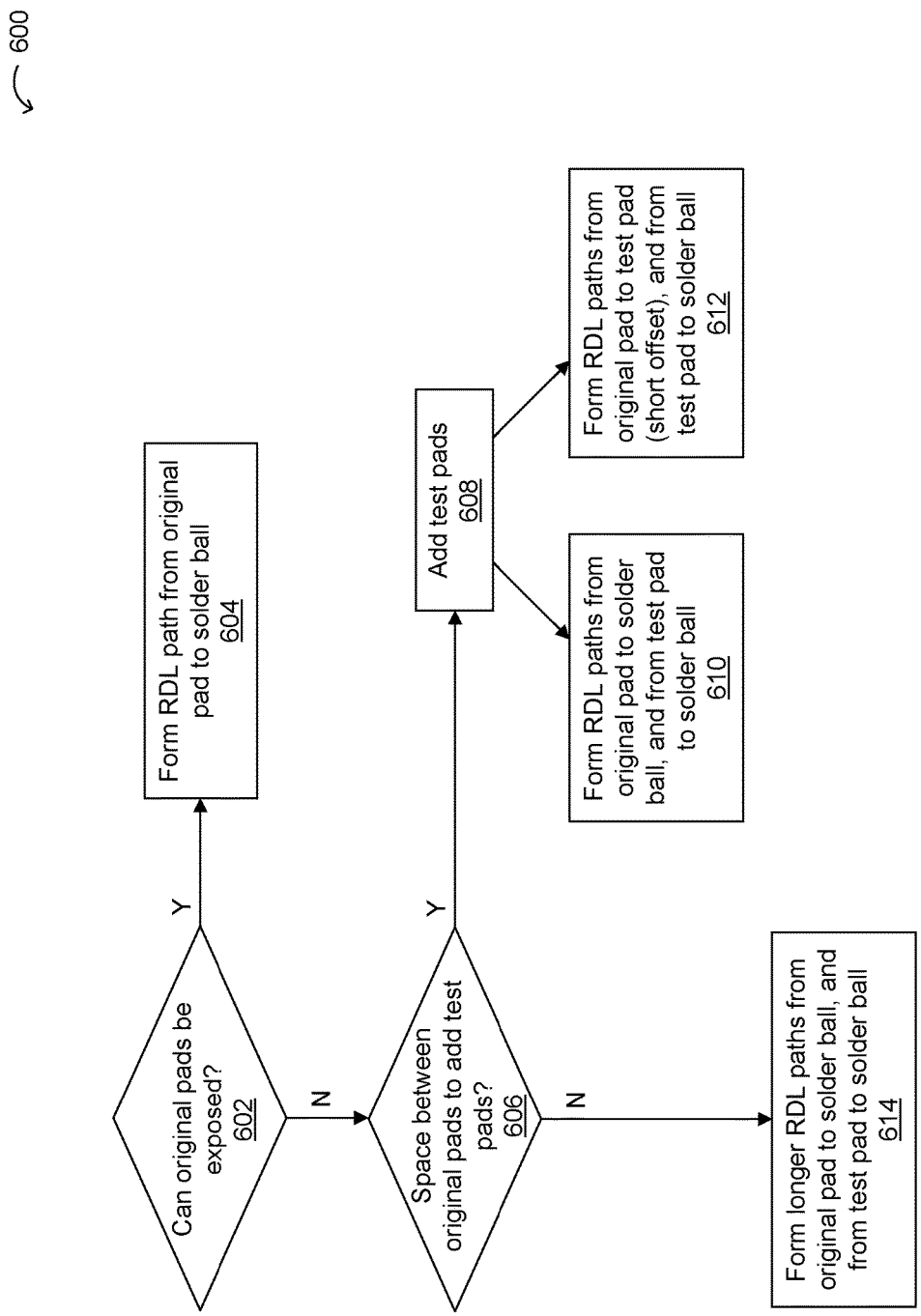
FIG. 6 is an example method of making a WLCSP with offset pads, in accordance with embodiments of the present invention.

Referring now to FIG. 6, shown is an example method of making a WLCSP with offset pads, in accordance with embodiments of the present invention. In example 600, if the original pads can be exposed at 602, then an RDL path can be formed from the original pad to the solder ball at 604 (see, e.g., FIG. 1). However, the approach of 604 may not provide protection of the original pad or testing of the RDL track between the solder ball and the original pad in some cases. In another example, two RDL paths (e.g., in different layers) can be formed between the original pad and the solder ball (see, e.g., FIG. 5). At 606, if there is sufficient space between the original pads to accommodate test pads, the test pads can be added (e.g., in a simultaneous process with the original pads) at 608. As discussed above, a same offset spacing can be utilized for each such original and test pad arrangement.

In the case whereby test pads can be added between original pads (see, e.g., FIG. 2), a relatively short offset between the original pads and the test pads can be accommodated. In one example of this approach at 610, RDL paths can be formed from the original pad to the solder ball, and from the test pad to the solder ball (see, e.g., bottom example in FIG. 2). The approach of 610 can allow for both the protection of the original pad and testing of the RDL track between the solder ball and the original pad. In another example of this approach at 612, RDL paths can be formed from the original pad to the test pad, and from the test pad to the solder ball (see, e.g., top example in FIG. 2). However, while the approach of 612 may allow for protection of the original pad, it may not allow the RDL track between the solder ball and the original pad to be tested in some cases. If there is insufficient space between the original pads to accommodate test pads at 606, a longer offset approach can be employed. At 614, longer RDL paths can be formed from the original pad to the solder ball, and from the test pad to the solder ball (see, e.g., FIG. 3). The approach of 614 can also allow for both the protection of the original pad and testing of the RDL track between the solder ball and the original pad.

Particular embodiments may be directed to various semiconductor devices (e.g., memory devices), including volatile memory, such as SRAM and DRAM, and including non-volatile memory (NVM), such as flash memory devices, and/or resistive switching memories (e.g., conductive bridging random-access memory [CBRAM], resistive RAM [ReRAM], etc.). Particular embodiments can include structures and/or methods of operating or forming flash and/or resistive switching memories that can be written (programmed/erased) between one or more resistance and/or capacitive states. In one particular example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, and in particular NVM devices, such as flash memory devices, and may include resistive switching memory devices in some cases.

Figure 7:
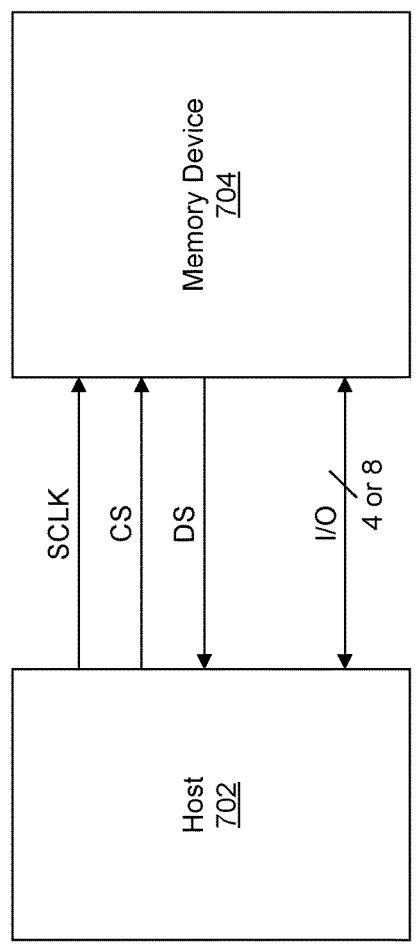
FIG. 7 is an example memory device and host arrangement, in accordance with embodiments of the present invention.

Referring now to FIG. 7, shown is an example memory device and host arrangement 700, in accordance with embodiments of the present invention. In this example, host 702 can interface with memory device 704 via a serial interface. The WLCSP approach as described herein is applicable to any semiconductor device, such as memory device 704 configured for a serial type of interface, or any type of signaling (e.g., analog, RF, etc.). For example, host 702 can be any suitable controller (e.g., CPU, MCU, general-purpose processor, GPU, DSP, etc.), and memory device 704 can be any type of memory device (e.g., SRAM, DRAM, EEPROM, Flash, CBRAM, magnetic RAM, ReRAM, etc.). Particular embodiments are applicable to any type of devices, signaling, etc., and the memory device arrangement described herein represents just one suitable example. Memory device 704 can thus be implemented in a variety of memory technologies, such as non-volatile types. In some cases, memory device 704 can be a serial flash memory that may be implemented in more traditional non-volatile memories, or in CBRAM/ReRAM resistive switching memories.

Various interface signals, such as in a serial peripheral interface (SPI), can be included for communication between host 702 and memory device 704. For example, serial clock (SCK) can provide a clock to device 704, and may be used to control the flow of data to the device. Command, address, and input data (e.g., via I/O pins) can be latched by memory device 704 on a rising edge of SCK, while output data (e.g., via I/O pins) can be clocked out of memory device 704 by SCK or data strobe (DS). Chip select (CS), which may be active low, can be utilized to select memory device 704, such as from among a plurality of such memory devices sharing a common bus or circuit board, or otherwise as a way to access the device. When the chip select signal is de-asserted (e.g., at a high level), memory device 704 can be deselected, and placed in a standby mode. Activating the chip select signal (e.g., via a high to low transition on CS) may be utilized to start an operation, and returning the chip select signal to a high state can be utilized for terminating an operation. For internally self-timed operations (e.g., a program or erase cycle), memory device 704 may not enter standby mode until completion of the particular ongoing operation if chip select is de-asserted during the operation.

In the example interface, data can be provided to (e.g., for write operations, other commands, etc.) and from (e.g., for read operations, verify operations, etc.) memory device 704 via the I/O signals. For example, input data on the I/O can be latched by memory device 704 on edges of SCK, and such input data can be ignored if the device is deselected (e.g., when the chip select signal is de-asserted). Data can be output from memory device 704 via the I/O signals as well. For example, data output from memory device 704 can be clocked out on edges of DS or SCK for timing consistency, and the output signal can be in a high impedance state when the device is deselected (e.g., when the chip select signal is de-asserted).

In any event, the probe cards that are used may have to be able to handle the presence of balls on the die (e.g., memory device 704). This can be facilitated with relatively small bumps and/or low bump heights with standard probe cards. For larger bumps, the probe card may have to be designed with longer needles, which can increase costs, and possibly reduce reliability. The pad surface of the new test pads has to be possible to probe, and while UBM metal compositions are typically designed for attaching solder balls, these or other suitable compositions for the test pads need to provide good contact for a probe tip. Thus, various metal compositions, hardness, and possible oxidation are among design/process considerations. In addition, test pads may be constructed such that probing does not damage the die, or any circuitry under the test pads. Further, chip pad layout can be designed in order to accommodate one or more of the various examples/options for test pad offset, as described herein.

Figure 8:
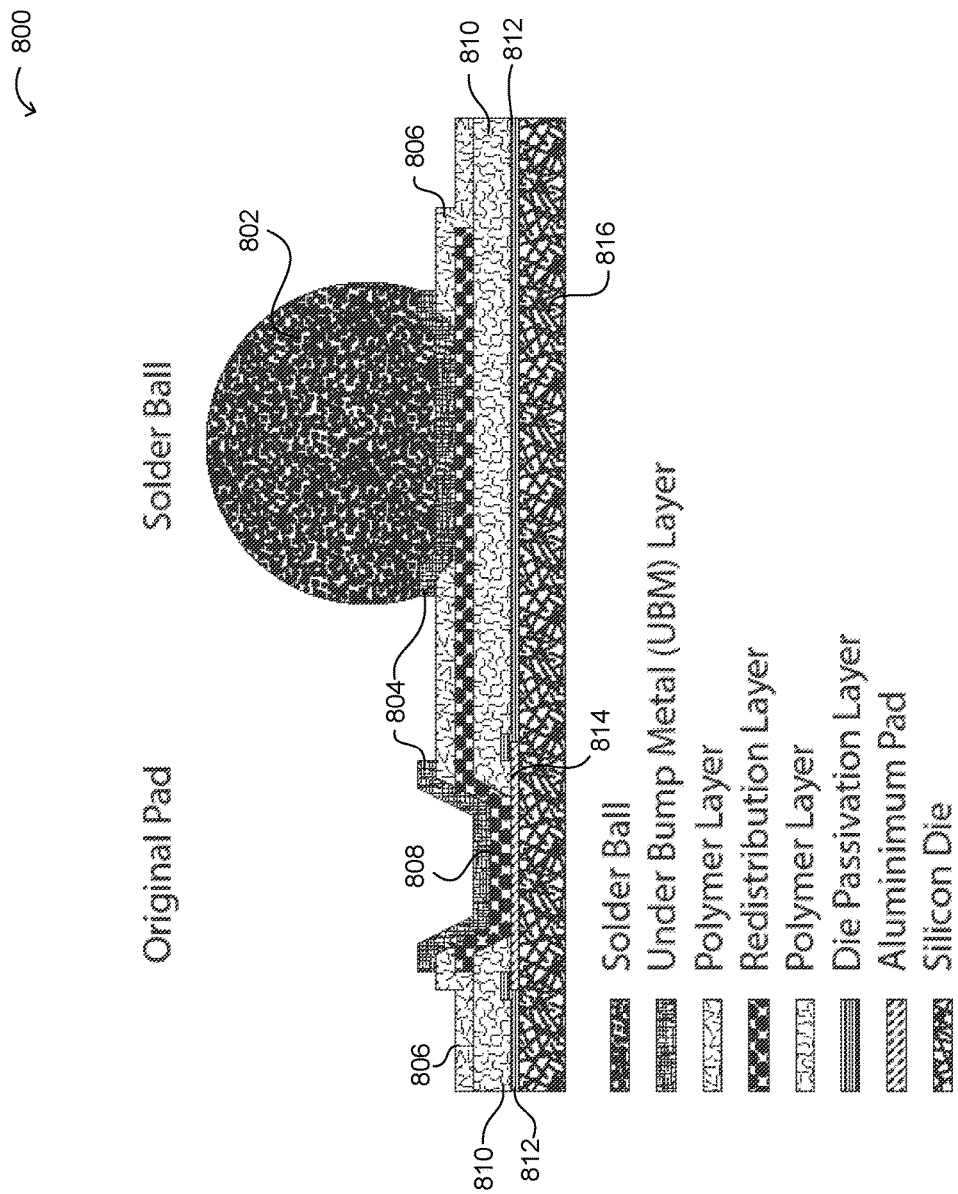
FIG. 8 is a side view diagram of an example WLCSP design with open pads, in accordance with embodiments of the present invention.
Figure 9:
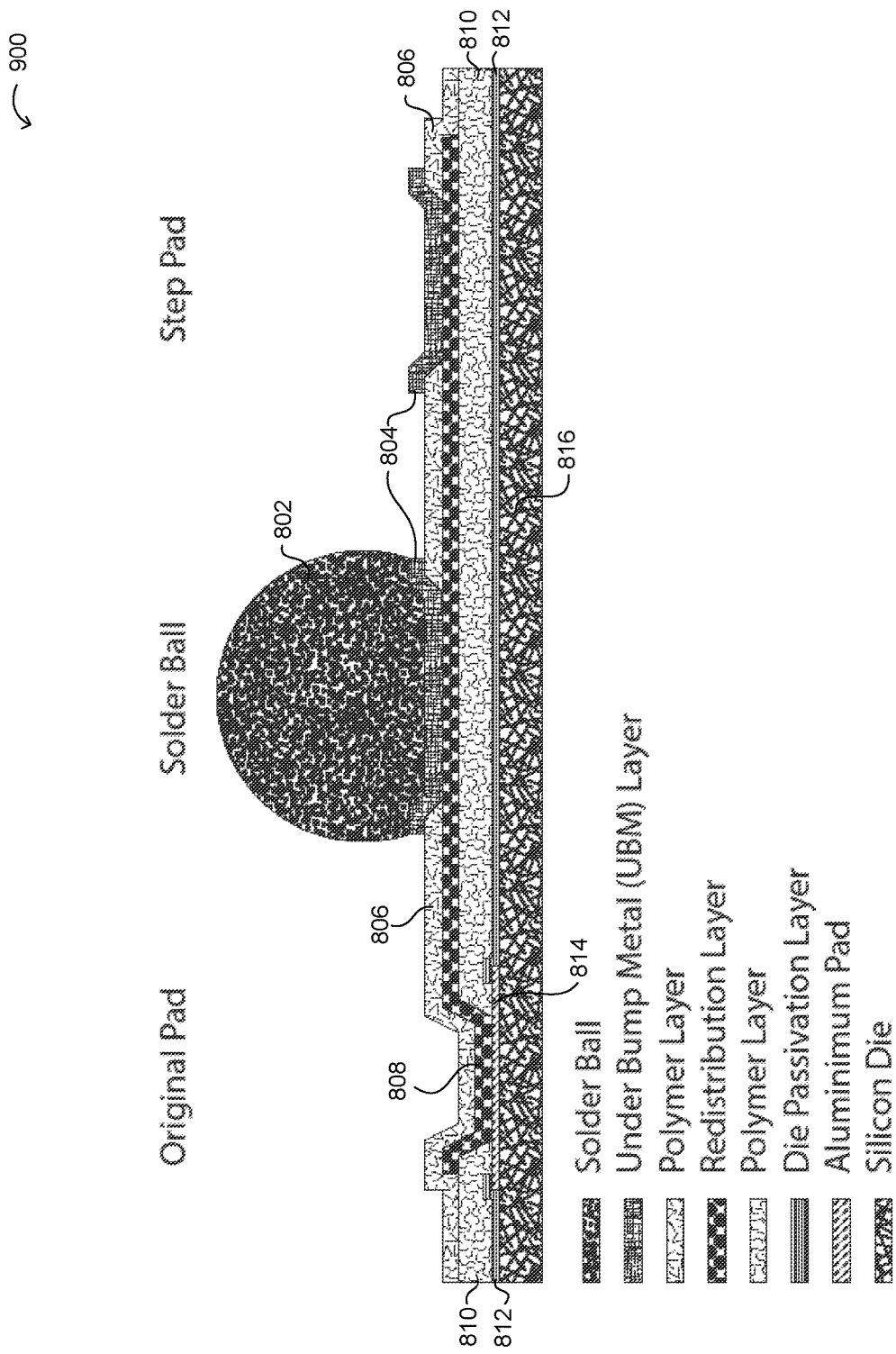
FIG. 9 is a side view diagram of an example WLCSP design with offset pads, in accordance with embodiments of the present invention.

Referring now to FIGS. 8, 9, and 10, shown are side view diagrams corresponding to the example WLCSP designs shown above, in accordance with embodiments of the present invention. Each example can include the following materials/structures: solder ball 802, under bump metal (UBM) layer 804, one polymer layer 806, redistribution layer 808, another polymer layer 810, die passivation layer 812, aluminum pad 814, and silicon die 816. In example 800 of FIG. 8, which corresponds to the structure of the invention, the original pad may be left open for probing. Example 900 of FIG. 9 corresponds to the structure of the bottom half of FIG. 2, as well as to FIG. 3. In example 1000 of FIG. 10, which corresponds to the structure of FIG. 5, the RDL pas may be placed above on top of the original pad, but may not be connected directly thereto. Thus, the signal path can span from the original pad, via the solder ball, and back to the RDL pad.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A device configured for wafer level chip scale packaging (WLCSP), the device comprising:
    a) a first pad;
    b) a test pad offset from the first pad;
    c) a first redistribution layer (RDL) path that connects the first pad to the test pad with no other pad connections therebetween; and
    d) a second RDL path that connects the test pad to a solder ball.

2. The device of claim 1, wherein the device comprises a serial non-volatile memory (NVM) device.

3. The device of claim 1, wherein the first and second RDL paths are in a same layer.

4. The device of claim 1, wherein the first and second RDL paths are in different layers.

5. The device of claim 1, further comprising a polymer layer that fully covers the first pad, and leaves a portion of the test pad exposed.

6. The device of claim 1, wherein the device further comprises:
    a) a plurality of the first pads; and
    b) a plurality of the test pads, where each of the plurality of the test pads is offset from a corresponding of the plurality of the first pads by a same offset length.

7. A device configured for WLCSP, the device comprising:
    a) a first pad;
    b) a test pad offset from the first pad;
    c) a first RDL path that connects the first pad to a solder ball; and
    d) a second RDL path that connects the test pad to the solder ball,
    e) wherein a length of the offset is substantially greater than a diameter of the solder ball.

8. The device of claim 7, wherein the device comprises a serial NVM device.

9. The device of claim 7, wherein the first and second RDL paths are in a same layer.

10. The device of claim 7, wherein the first and second RDL paths are in different layers.

11. The device of claim 7, further comprising a polymer layer that fully covers the first pad, and leaves a portion of the test pad exposed.

12. The device of claim 7, wherein the device further comprises:
    a) a plurality of the first pads; and
    b) a plurality of the test pads, where each of the plurality of the test pads is offset from a corresponding of the plurality of the first pads by a same offset length.

13. A wafer comprising the device of claim 7, the wafer comprising:
    a) a first semiconductor device comprising the first pad; and
    b) a second semiconductor device comprising the test pad.

14. The wafer of claim 13, wherein each of the first and second semiconductor devices comprises a serial NVM device.

15. A device configured for WLCSP, the device comprising:
    a) a first pad;
    b) a test pad offset from the first pad;
    c) a first RDL path that connects the first pad to a solder ball; and
    d) a second RDL path that connects the test pad to the solder ball,
    e) wherein a length of the offset is about a diameter of the solder ball.

16. The device of claim 15, wherein the device comprises a serial NVM device.

17. The device of claim 15, wherein the first and second RDL paths are in a same layer.

18. The device of claim 15, wherein the first and second RDL paths are in different layers.

19. The device of claim 15, further comprising a polymer layer that fully covers the first pad, and leaves a portion of the test pad exposed.

20. The device of claim 15, wherein the device further comprises:
    a) a plurality of the first pads; and
    b) a plurality of the test pads, where each of the plurality of the test pads is offset from a corresponding of the plurality of the first pads by a same offset length.

* * * * *